United States Patent
Wang et al.

(10) Patent No.: US 6,511,923 B1
(45) Date of Patent: Jan. 28, 2003

(54) DEPOSITION OF STABLE DIELECTRIC FILMS

(75) Inventors: Yaxin Wang, Fremont, CA (US); Michael Barnes, San Francisco, CA (US); Thanh N. Pham, San Jose, CA (US); Farhad Moghadam, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/574,404

(22) Filed: May 19, 2000

(51) Int. Cl.$^7$ ................................................ H01L 21/31
(52) U.S. Cl. .................... 438/783; 438/787; 438/789; 438/763
(58) Field of Search ................................. 438/624, 631, 438/635, 645, 787, 633, 699, 691, 692, 695, 758–765, 766–800; 257/760, 776

(56) References Cited

U.S. PATENT DOCUMENTS

| | | | | |
|---|---|---|---|---|
| 5,173,151 A | * | 12/1992 | Namose ........................ 216/38 |
| 5,204,288 A | * | 4/1993 | Marks et al. ................. 438/699 |
| 5,286,681 A | * | 2/1994 | Maeda et al. ................ 438/760 |
| 5,376,591 A | * | 12/1994 | Maeda et al. ........ 148/DIG. 118 |
| 5,563,104 A | * | 10/1996 | Jang et al. .................... 438/624 |
| 5,605,859 A | * | 2/1997 | Lee ............................... 438/384 |
| 5,661,093 A | | 8/1997 | Ravi et al. .................... 438/763 |
| 5,665,643 A | | 9/1997 | Shin ............................. 438/624 |
| 5,783,488 A | * | 7/1998 | Bothra et al. ................ 438/666 |
| 5,792,702 A | * | 8/1998 | Liang ........................... 438/624 |
| 5,804,498 A | * | 9/1998 | Jang et al. .................... 438/624 |
| 5,818,111 A | * | 10/1998 | Jeng et al. .................... 257/748 |
| 5,821,174 A | * | 10/1998 | Hong et al. .................. 438/622 |
| 5,861,342 A | * | 1/1999 | Gabriel et al. ............... 438/631 |
| 5,880,518 A | | 3/1999 | Oda et al. .................... 257/635 |
| 5,891,800 A | * | 4/1999 | Ben-Guigui et al. ........ 438/631 |
| 5,908,672 A | * | 6/1999 | Ryu et al. .................... 427/574 |
| 5,930,677 A | * | 7/1999 | Zheng et al. ................ 438/782 |
| 5,937,323 A | | 8/1999 | Orczyk et al. ............... 438/624 |
| 5,946,542 A | * | 8/1999 | Iyer ................................ 438/7 |
| 6,017,780 A | * | 1/2000 | Roy et al. .................... 438/152 |
| 6,046,101 A | * | 4/2000 | Dass et al. ................... 438/624 |
| 6,048,475 A | * | 4/2000 | Kirchhoff et al. ........... 438/760 |
| 6,048,802 A | * | 4/2000 | Avanzino et al. ........... 438/622 |
| 6,069,069 A | * | 5/2000 | Chooi et al. ................. 438/631 |
| 6,093,637 A | * | 7/2000 | Kishimoto et al. .......... 438/624 |
| 6,133,160 A | * | 10/2000 | Komiyama et al. ......... 438/761 |
| 6,133,163 A | * | 10/2000 | Tanaka et al. ............... 438/782 |
| 6,159,872 A | * | 12/2000 | Essaian et al. .............. 257/346 |
| 6,174,808 B1 | * | 1/2001 | Jang et al. .................... 438/680 |
| 6,200,653 B1 | * | 3/2001 | Tsai et al. .................... 438/579 |

(List continued on next page.)

FOREIGN PATENT DOCUMENTS

| | | | | |
|---|---|---|---|---|
| EP | 0537001 A1 | * | 4/1993 | ........... H01L/21/90 |
| EP | 1063692 A1 | * | 12/2000 | ......... H01L/21/316 |

*Primary Examiner*—Long Pham
*Assistant Examiner*—Brook Kebede
(74) *Attorney, Agent, or Firm*—Townsend and Townsend and Crew, LLP (57) ABSTRACT

A composite insulating film including three layers is formed on a substrate having a gap. The first layer partially fills the gap and contains a dielectric material having a low dielectric constant, such as halogen-doped silicate glass. The second layer is formed over the first layer, and contains an undoped dielectric material such as silicon oxide, nitride, or oxynitride. The second layer is more stable and integrable, and less susceptible to moisture absorption and outgassing, than the first layer. The second layer is substantially smaller in thickness than the first layer, and at least substantially fills the gap. The third layer is formed over the second layer, and contains a dielectric material having a low dielectric constant, such as halogen-doped silicate glass. In a specific embodiment, the first layer is formed by plasma-enhanced chemical vapor deposition in which reactive species are generated from a process gas mixture by plasma for sputtering the first layer.

20 Claims, 7 Drawing Sheets

U.S. PATENT DOCUMENTS

| | | | |
|---|---|---|---|
| 6,200,897 B1 * | 3/2001 | Wang et al. | 438/692 |
| 6,211,050 B1 * | 4/2001 | Wong | 438/597 |
| 6,225,236 B1 * | 5/2001 | Nishimoto et al. | 438/436 |
| 6,228,781 B1 * | 5/2001 | Murugesh et al. | 438/784 |
| 6,319,848 B1 * | 11/2001 | Litwin et al. | 438/761 |
| 6,372,664 B1 * | 4/2002 | Jang et al. | 438/624 |
| 6,399,489 B1 * | 6/2002 | M'Saad et al. | 438/479 |
| 6,423,654 B1 * | 7/2002 | Sim et al. | 438/791 |
| 6,426,285 B1 * | 7/2002 | Chen et al. | 438/624 |
| 6,429,147 B2 * | 8/2002 | Hara | 438/763 |
| 6,432,845 B1 * | 8/2002 | Morozumi | 438/789 |

\* cited by examiner

DEPOSITION OF STABLE DIELECTRIC FILMS

BACKGROUND OF THE INVENTION

The present invention relates to methods and apparatus for substrate processing. More particularly, the present invention relates to methods and apparatus for improved deposition of stable dielectric films.

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma enhanced CVD processes promote the excitation and/or dissociation of the reactant gases by the application of radio frequency (RF) energy to the reaction zone proximate the substrate surface thereby creating a plasma of highly reactive species. The high reactivity of the released species reduces the energy required for a chemical reaction to take place, and thus lowers the required temperature for such CVD processes.

In one design of plasma CVD chambers, a vacuum chamber is generally defined by a planar substrate support, acting as a cathode, along the bottom, a planar anode along the top, a relatively short sidewall extending upwardly from the bottom, and a dielectric dome connecting the sidewall with the top. Inductive coils are mounted about the dome and are connected to a source radio frequency (SRF) generator. The anode and the cathode are typically coupled to bias radio frequency (BRF) generators. Energy applied from the SRF generator to the inductive coils forms a plasma within the chamber. Such a chamber is referred to as a high density plasma CVD (HDP-CVD) chamber.

Halogen-doped silicon oxide layers, and fluorine-doped silicate glass (FSG) layers in particular, are becoming increasingly popular in a variety of applications due to the lower dielectric constants achievable for these films than for silicon oxide, which is the conventional dielectric material for inter-metal dielectric and trench isolation, as well as their excellent gap-fill properties. Other fluorine-doped dielectric materials such as fluorine-doped amorphous carbon have also been used.

The use of fluorine-doped dielectric layers poses several problems, particularly in multilayer processing. For instance, when used as an intermetal dielectric layer, the fluorine-doped film exhibits relatively poor adhesion with the metal layers. Presently used techniques tend to create unacceptable film adhesion for some applications when depositing fluorinated silicon glass (FSG) films integrated with other films such as Ti, TiN, W, Al, etc. The FSG film may have loosely bonded fluorine atoms that result in $H_2O$, H, or OH absorption and subsequent undesirable $H_2O$, H, or OH and hydrofluorine (HF) outgassing at levels that do not fall within manufacturing requirements of certain applications, such as intermetal dielectric application of integrated semiconductor devices. The dielectric constant of the film may rise due to the loss of fluorine and water vapor absorption, resulting in a reduction in device speed. HF may corrode, and even destroy, other device features such as metal lines or antireflective layers, thereby degrading device performance. These problems are exacerbated when the halogen-doped dielectric layer undergoes subsequent processing steps in device integration such as chemical mechanical polishing (CMP) planarization.

The instability of fluorine bonding to silicon atoms can be developed over a long period of time during or after semiconductor device integration. For instance, moisture uptake by the dielectric film, resulting in —H and —OH absorption and subsequent undesirable Si—H, Si—OH, and H—F formation with decomposition of Si—F bonds, may occur at different thermal cycles during integration. Those unstable species such as H, OH, $H_2O$, and HF will be condensed at the interface of different layers of integrated films. The condensation at the interface may form a cloudy haze, or even bubbles, which eventually will cause delamination of the film and destroy the semiconductor device. This type of moisture absorption may be controlled by the wafer processing shelf-life time or ambient conditions. Since modem device fabrication often uses distributed processing where a wafer is processed at several different locations under different chemical and physical conditions over a period of several weeks, it will be very difficult to control the shelf-life time and all process conditions to prevent haze and bubbles from forming. Furthermore, if haze or bubbles are developed, not only does the entire wafer need to be rejected from the processing sequence, but also the rest of the wafer may be sacrificed.

Generally speaking, the higher the concentration of fluorine during deposition of the fluorine-doped layer, the more unstable the fluorine bonds that are formed and the greater the propensity to form haze. Thus, chip manufacturers may use a relatively low concentration of fluorine just to increase process margin. If manufacturers could rely on producing a more stable film, however, they could increase the fluorine concentration and enjoy the resultant benefit of a dielectric layer with a lower dielectric constant to enhance the device speed.

Problems such as moisture absorption and outgassing are also present in other low dielectric constant layers. For example, a low density silicon oxide layer derives its low dielectric constant from an increase in porosity. The increased porosity, however, renders the layer more susceptible moisture absorption and outgassing.

Figure 1:
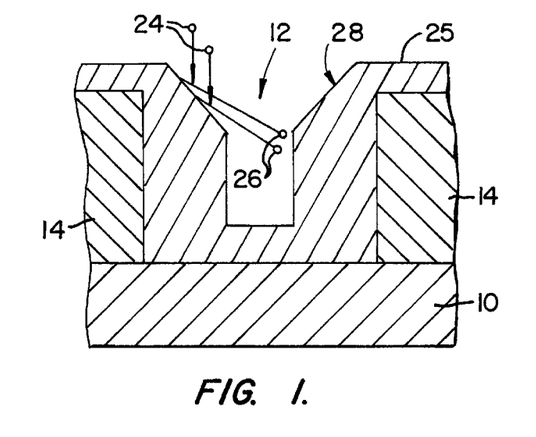
FIG. 1 is a simplified cross-sectional view of a dielectric layer deposited over a substrate having a gap employing sputter control.

When sputter deposition is used to form a doped dielectric layer, the stability and integration problems of the layer are believed to be caused at least in part by sputtering. Sputter deposition is commonly used in an HDP-CVD process for gap-fill in which physical sputtering of the dielectric layer by ion bombardment keeps the trench open during gap-fill to prevent premature closing of the trench and minimize the formation of voids during deposition of the dielectric layer. The effects of the physical sputtering dep-etch technique is shown in FIG. 1. A substrate 10 has a gap 12 between two islands 14 which define the sidewalls of the gap 12. Ions 24 incident on the dielectric material of the layer 25 transfer energy thereto by collision, allowing atoms 26 to overcome local binding forces and eject therefrom. During the dep-etch process, dielectric material fills the gap 12 forming a surface 28. The surface 28 lies in a plane that extends obliquely to the sidewalls of the islands 14, commonly referred to as a facet. Sputtering can keep the trench open during trench fill to minimize void formation due to premature closing of the trench. Excessive sputtering, however, can lead to void formation by redeposition of the sputtered material and result in unstable film characteristics.

What is needed are methods and apparatus for depositing stable dielectric layers such as halogen-doped layers and low density dielectric layers having relatively low dielectric constants and improved integration characteristics.

SUMMARY OF THE INVENTION

The present invention provides methods and apparatus for depositing stable dielectric layers. Specific embodiments provide improved methods for depositing a composite insulating film having three layers. A first layer has a low dielectric constant derived from the presence of dopants such as fluorine or from the increased porosity of a low density layer. A relatively thin second layer of undoped or slightly doped dielectric material such as silicon oxide, nitride, or oxynitride is formed over the first layer. A third layer such as a fluorine-doped layer having a low dielectric constant is formed over the second layer. The third layer may contain the same dielectric material as the first layer, or a different material. The second layer is more stable than the first layer and serves to protect the first layer by substantially isolating it from subsequent process steps such as planarization by CMP which can have significant adverse effects on the integrity and properties of the first layer. The second layer serves as a blocking layer from moisture absorption, outgassing, and undesirable chemical attack. The second layer is desirably also more integrable, for example, by providing good adhesion with subsequent metal layers, capping layers, and the like. As a result, the second layer makes it possible to increase the dopant content and/or porosity in the first layer to further lower the dielectric constant of the first layer without introducing additional instability concerns. The composite insulating layer thus has desirable dielectric properties and stability characteristics.

In accordance with an embodiment of the present invention, a method for forming an insulating layer on a substrate including a gap comprises forming a first layer containing a dielectric material over the substrate to partially fill the gap. A second layer containing a dielectric material which is at least substantially undoped is formed over the first layer to at least substantially fill the gap. The second layer is substantially smaller in thickness than the first layer. The dielectric material in the second layer is different from the dielectric material in the first layer. A third layer containing a dielectric material is formed over the second layer. The dielectric material in the third layer is different from the dielectric material in the second layer. In a specific embodiment, the first layer comprises an FSG layer, the second layer comprises a silicon oxide, nitride, or oxynitride layer, and the third layer comprises an FSG layer. The first layer fills more than about 75% of the gap, and more desirably fills about 80% to about 90% of the gap. The second layer has a thickness of less than about 500 Å, and more desirably a thickness of about 50 Å–200 Å. The third layer desirably has a thickness that meets the required device integration process.

In a specific embodiment, the first layer is formed by placing the substrate in a process chamber and flowing a process gas mixture containing precursor of the dielectric material of the first layer into the process chamber. A plasma is formed in the process chamber to deposit the first layer. The dielectric material for the first layer is a low dielectric constant material or any desired doped material.

In accordance with another embodiment of the invention, a method for forming an insulating layer on a substrate including a gap comprises forming a first layer containing a dielectric material over the substrate to partially fill the gap. A second layer containing a dielectric material is formed over the first layer to at least substantially fill the gap. The second layer is substantially smaller in thickness than the first layer. The dielectric material in the second layer has a higher dielectric constant than the dielectric material in the first layer. A planarization is performed on the substrate to a level at or above the opening of the gap. The opening of the gap is covered substantially by the dielectric material of the second layer after planarization. In a specific embodiment, a third layer containing a dielectric material having a lower dielectric constant than the dielectric material of the second layer is formed over the second layer prior to planarization.

DESCRIPTION OF THE SPECIFIC EMBODIMENTS

I. Deposition of Dielectric Films

Specific embodiments of the present invention are illustrated using gap-fill of a substrate having a gap. The present invention allows deposition of a stable insulating layer having a relatively low dielectric constant and good gap-fill properties. It is understood, however, that the scope of the invention is not necessarily limited to gap-fill of a trenched or patterned substrate.

One way of depositing a more stable and integrable dielectric layer according to the present invention is based on forming a composite insulating film having a stable intermediate dielectric layer which is at least substantially undoped and sandwiched between two less stable dielectric layers. The intermediate dielectric layer typically has a dielectric constant which is comparable with the dielectric constants of the two remaining layers of the composite film and serves as a blocking layer as explained in detail below.

Figure 2:
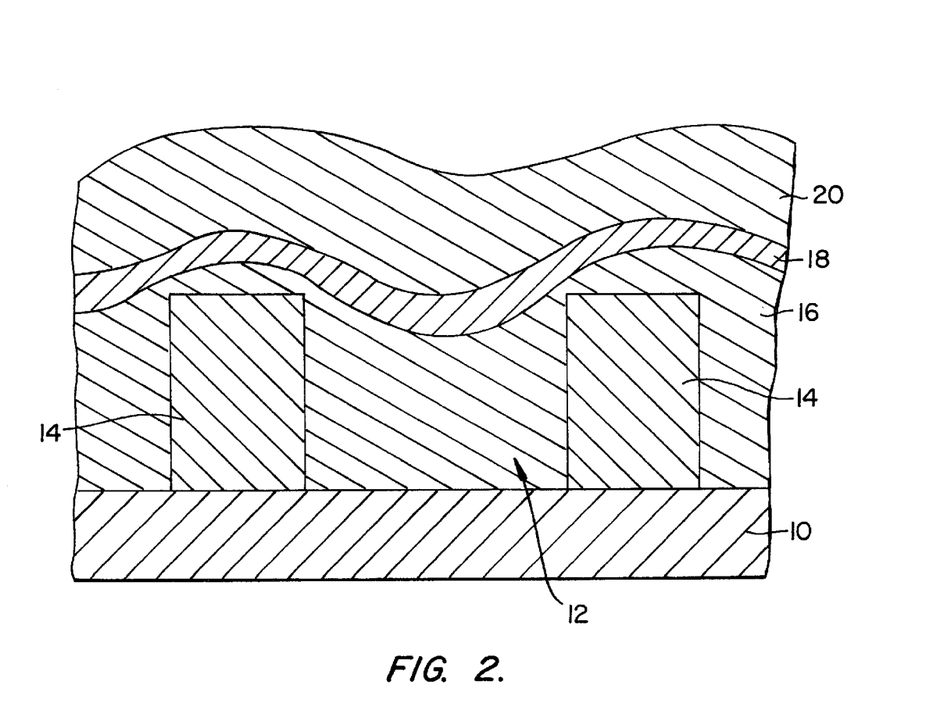
FIG. 2 is a simplified cross-sectional view of a composite insulating layer having a three-layer structure deposited over a substrate having a gap according to an embodiment of the present invention.

As shown in FIG. 2, the substrate 10 has the gap 12 between two islands 14. In a specific embodiment, the substrate 10 is made of silicon and the islands 14 are device metal lines formed on the silicon substrate 10. A first dielectric layer 16 is formed over the trenched substrate 10 to partially fill the gap 12. In a specific embodiment, the first dielectric layer 16 fills at least about 75% of the gap 12, and more desirably about 80% to about 90% of the gap 12. A second dielectric layer 18 is formed over the first dielectric layer 16 to at least substantially fill the gap 12. Due to the deposition profile of the first layer 16, the second layer 18 covers a large portion of the opening of the gap 12 at the level of the upper surfaces of the islands 14. In a specific embodiment, the second layer 18 covers at least about 75% of the opening of the gap 12, and more desirably about 80% to about 90% of the opening of the gap 12. A third dielectric layer 20 is deposited over the second dielectric layer 18 to form a composite insulating layer having a sandwiched structure.

The first dielectric layer 16 preferably includes a dielectric material having a dielectric constant that is lower than that of a conventional silicon oxide layer. The dielectric constant is typically less than about 4, more desirably less than about 3 and most desirably less than about 2.5. The first dielectric layer 16 may be a halogen-doped dielectric layer such as a fluorine-doped silicate glass (FSG) layer or a carbon-doped porous silicon oxide layer. In a specific embodiment, the first dielectric layer 16 in the form of a doped silicate glass such as FSG is deposited on the silicon substrate 10 employing a plasma-assisted CVD system, more desirably an HDP-CVD system. The substrate 10 has a gap which is filled as an isolation trench or inter-metal dielectric between metal lines or the like. The deposition takes place in a process chamber in which a process gas mixture is flowed across the surface of the substrate 10. A typical process gas mixture includes a silicon source gas such as silane ($SiH_4$), an oxygen source gas such as molecular oxygen ($O_2$), a dopant source such as $SiF_4$ or $CH_4$, and an inert gas such as argon (Ar) or helium (He). The gas mixture reacts chemically and deposits an FSG layer or a carbon-doped silicon oxide layer as the first dielectric layer 16.

As discussed above, the FSG layer may have loosely bonded fluorine atoms that result in $H_2O$, H, or OH absorption and subsequent undesirable $H_2O$, H, or OH and HF outgassing at levels that do not fall within manufacturing requirements of certain applications. Alternatively, the first dielectric layer 16 may have a porous structure designed to produce a low dielectric constant. An example of a porous dielectric layer is a low density silicon oxide layer. The increased porosity, however, also renders the first dielectric layer 16 more susceptible to moisture absorption and outgassing.

The second dielectric layer 18 includes a dielectric material that is more stable and integrable than the first dielectric layer 16 and has dielectric properties that are comparable to those of the first layer 16. The characteristics of the second dielectric material are substantially constant over time. The second dielectric layer 18 typically includes a material that is at least substantially undoped. The second dielectric layer 18 serves as a blocking layer against possible outgassing and diffusion of species. Examples of a suitable second dielectric material include silicon oxide, silicon nitride, silicon oxynitride, and the like. In a specific embodiment, the second dielectric layer 18 in the form of an undoped silicon oxide, nitride, or oxynitride layer is deposited on the silicon substrate 10 employing a plasma-assisted CVD system such as an HDP-CVD system. The deposition takes place in a process chamber in which a process gas mixture is flowed across the surface of the first layer 16 on the substrate 10. A typical process gas mixture includes a silicon source gas such as silane ($SiH_4$) for silicon-based dielectric materials. The mixture further includes (i) an oxygen source gas such as molecular oxygen ($O_2$) or nitrous acid ($N_2O$) for depositing a silicon oxide layer; (ii) a nitrogen source gas such as nitrogen ($N_2$) or ammonia ($NH_3$) for depositing a silicon nitride layer; (iii) oxygen and nitrogen source gases such as $NH_3$ and $N_2O$ for depositing a silicon oxynitride layer; or (iv) carbon source gases including hydrocarbons such as $CH_4$, $C_2H_4$, $C_2H_2$, and $SiH_3$—$CH_3$. An inert gas such as helium (He) or argon (Ar) may be used for controlling the process such as the deposition rate, and for stabilizing the process. Alternatively, the second layer 18 may contain a relatively small amount of dopants such as fluorine. Note that the profiles of the deposited layers 16, 18 will be more jagged in the gap 12 than those shown due to sputtering (see, e.g., FIG. 1).

Because the dielectric material in the second layer 18 typically has a higher dielectric constant than the dielectric material in the first layer 16, the thickness of the second layer 18 is kept substantially smaller than the thickness of the first layer 16. In one embodiment, the thickness of the second layer 18 is less than about 500 Å and is more desirably equal to about 50 Å to about 200 Å.

The third dielectric layer 20 typically includes a dielectric material having a relatively low dielectric constant. For instance, the dielectric constant of the third dielectric layer 20 is generally equal to that of the first layer 16. In a specific embodiment, the third dielectric layer 20 contains the same dielectric material as the first dielectric layer 16 and is formed using generally the same process gases and equipment.

In a preferred embodiment, in situ deposition of the three dielectric layers 16, 18, 20 is performed in an HDP-CVD chamber by selectively flowing different process gases into the chamber to deposit the different layers. In a specific embodiment, the first layer 16 is formed by placing the substrate in a process chamber and flowing a process gas mixture including halogen dopants into the process chamber. The process gas mixture into the process chamber is adjusted to at least substantially eliminate the halogen dopants to form the second layer 18 over the first layer 16. The second layer 18 is undoped or slightly doped with the halogen dopants. The third layer 20 is formed over the second layer 18 by adjusting the process gas mixture into the process chamber to increase the amount of the halogen dopants from the amount of the halogen dopants for forming the second layer 18.

Figure 3:
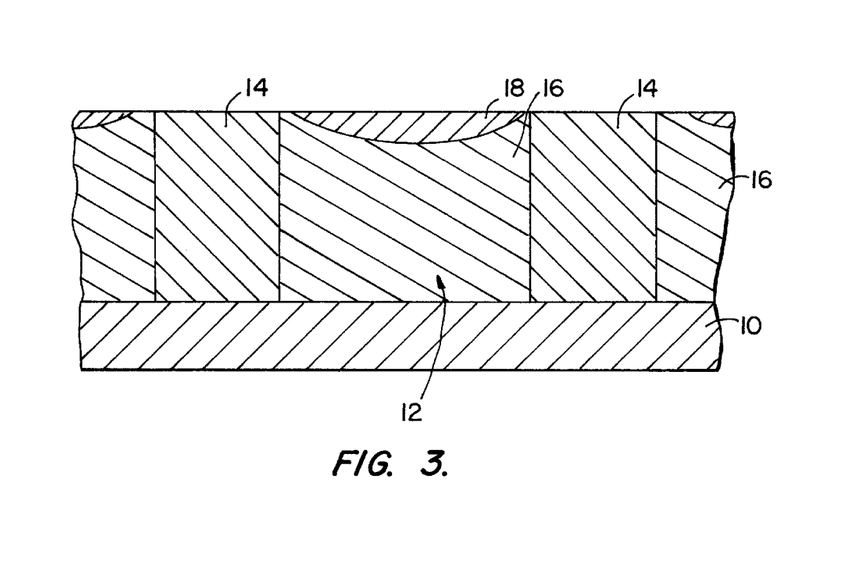
FIG. 3 is a simplified cross-sectional view of the composite insulating layer of FIG. 2 after planarization down to the opening of the gap.
Figure 4:
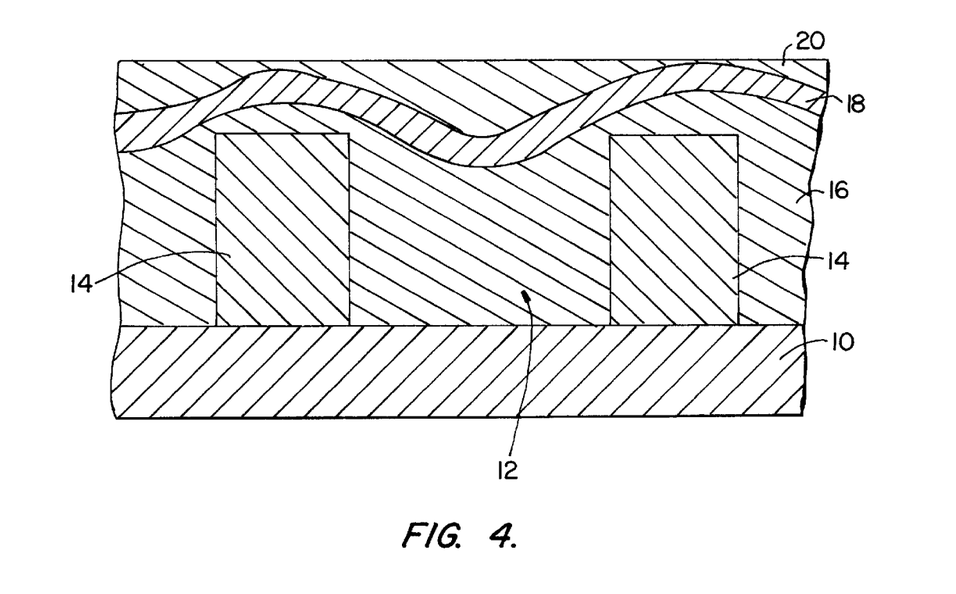
FIG. 4 is a simplified cross-sectional view of the composite insulating layer of FIG. 2 after planarization down to a level above the opening of the gap.

The composite insulating layer of FIG. 2 typically undergoes additional processing steps. A planarization procedure such as chemical mechanical polishing (CMP) is common after dielectric deposition prior to subsequent processing. The CMP or other planarization procedure is typically performed to a level at or above the upper surfaces of the islands 14. Because the second dielectric layer 18 covers a substantial portion of the opening of the gap 12 at the level of the upper surfaces of the islands 14, the planarization procedure reaches a relatively small portion of the first dielectric layer 16 even when it is performed down to the level of the upper surfaces of the islands 14 (FIG. 3). More typically, planarization is performed at a level slightly above the upper surfaces of the islands 14, so that it reaches only a very small portion or none of the first dielectric layer 16 (FIG. 4). After planarization, subsequent processing steps may be performed, including deposition of a capping layer or additional dielectric layers, via etch, deposition of metal lines, and the like.

The more stable second dielectric layer 18 serves to protect the first layer 16 by substantially isolating it from subsequent process steps such as planarization by CMP which can have significant adverse effects on the integrity and properties of the first layer 16. For example, a halogen-doped film as the first layer 16 may exhibit problems such as moisture absorption, outgassing, and haze formation. The stable dielectric layer 18 is substantially less susceptible to moisture absorption and outgassing. The deposition of the second dielectric layer 18 on the first dielectric layer 16 results in improved stability and immunity to moisture absorption for the composite insulating layer.

The second layer 18 advantageously is dense, uniform, and chemically stable, and is able to endure CMP without opening up voids or creases. The second layer 18 is desirably also more integrable, for example, by providing good adhesion with subsequent metal layers, capping layers, and the like. As a result, the use of the second dielectric layer 18 provides a larger process window for dielectric layer 16 between the islands 14 than without the layer 18. In doing so, the second layer 18 makes it possible to increase the dopant content such as the fluorine content in or simplify post-deposition treatment process of the first layer 16 to further lower the dielectric constant of the first layer 16 without introducing additional instability concerns. The composite insulating layer has desirable dielectric properties and stability characteristics.

Because the dielectric constant of the second dielectric layer 18 is typically higher than that of the first layer 16 and the third layer 20, it will tend to raise the overall (RC) value of the composite layer. By keeping the thickness of the second layer 18 relatively small, the effect on the time constant RC-delay is minimized, particularly for the inter-metal layer dielectric isolation since the layer 20 serves as the inter-metal layer dielectric isolation. In one embodiment, the height of the islands 14 is about 5,000–10,000 Å, while the thickness of the second layer 18 is less than about 500 Å and is more desirably equal to about 50 Å to about 200 Å.

II. An Exemplary CVD System

Figure 5:
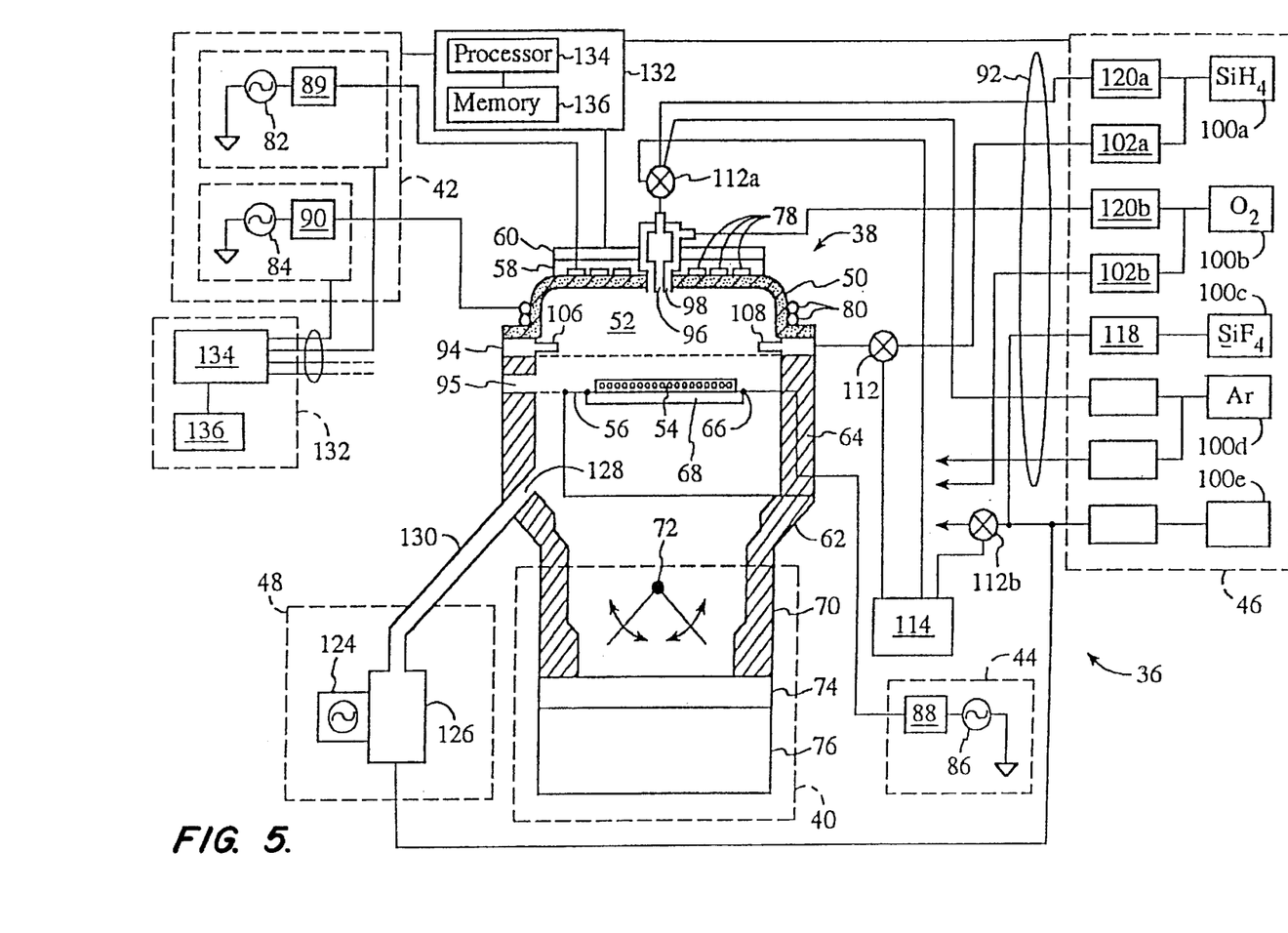
FIG. 5 is a simplified diagram of one embodiment of an HDP-CVD system according to the present invention.

FIG. 5 illustrates one embodiment of an HDP-CVD system 36, in which dielectric layers according to the present invention can be deposited. The system 36 includes a process chamber 38, a vacuum system 40, a source plasma system 42, a bias plasma system 44, a gas delivery system 46, and a remote plasma cleaning system 48.

An upper portion of process chamber 38 includes a dome 50, which is made of a dielectric material, such as alumina or aluminum nitride. The dome 50 defines an upper boundary of a plasma processing region 52. The plasma processing region 52 is bounded on the bottom by the upper surface of substrate 54 and the substrate support member 56.

A heater plate 58 and a cold plate 60 surmount, and are thermally coupled to, the dome 50. The heater plate 58 and the cold plate 60 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The lower portion of process chamber 38 includes a body member 62, which joins the process chamber to the vacuum system. A base portion 64 of the substrate support member 56 is mounted on, and forms a continuous inner surface with, body member 62. Substrates are transferred into and out of process chamber 38 by a robot blade (not shown) through an insertion/removal opening 95 in the side of process chamber 38. A motor (not shown) raises and lowers a lift-pin plate (not shown) that raises and lowers lift pins (not shown) that raise and lower the wafer. Upon transfer into process chamber 38, substrates are loaded onto the raised lift pins, and then lowered to a substrate receiving portion 66 of substrate support member 56. Substrate receiving portion 66 includes an electrostatic chuck 68 that secures the substrate to substrate support member 56 during substrate processing.

The vacuum system 40 includes a throttle body 70, which houses twin-blade throttle valve 72 and is attached to gate valve 74 and turbomolecular pump 76. It should be noted that throttle body 70 offers minimum obstruction to gas flow, and allows symmetric pumping, as described in co-pending, co-assigned United States Patent Application, originally filed on filed Dec. 12, 1995, and assigned Ser. No. 08/574,839, refiled on Sep. 11, 1996 and assigned Ser. No. 08/712,724 entitled "SYMMETRIC CHAMBER". The gate valve 74 can isolate the pump 76 from the throttle body 70, and can also control process chamber pressure by restricting the exhaust flow capacity when throttle valve 72 is fully open. The arrangement of the throttle valve 72, gate valve 74, and turbo molecular pump 76 allow accurate and stable control of process chamber pressures from about 1 to 100 millitorr.

The source plasma system 42 includes a top coil 78 and side coil 80, mounted on dome 50. A symmetrical ground shield (not shown) reduces electrical coupling between the coils. Top coil 78 is powered by top RF source generator 82, while the side coil 80 is powered by side RF source generator 84, allowing independent power levels and frequencies of operation for each coil. This dual coil system allows control of the radial ion density in process chamber 38, thereby improving plasma uniformity. Side coil 80 and top coil 78 couple energy into the chamber 38 inductively. In a specific embodiment, the top RF source generator 82 provides up to 2500 W of RF power at nominally 2 MHz and the side RF source generator 84 provides up to 5000 W of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

The RF generators 82 and 84 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators are typically designed to operate into a load with a characteristic impedance of 50Ω. RF power may be reflected from loads that have a different characteristic impedance than the generator. This can reduce power transferred to the load. Additionally, power reflected from the load back to the generator may overload and damage the generator. Because the impedance of a plasma may range from less than 5Ω to over 900Ω, depending on the plasma ion density among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 89 and 90 match the output impedance of generators 82 and 84 with coils 78 and 80, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions such as different process gas compositions and process pressure levels by holding the matching network constant at its most recent condition.

The bias plasma system 44 includes an RF bias generator 86 and a bias matching network 88. The bias plasma system 44 capacitively couples substrate receiving portion 66 to the body member 62, which act as complementary electrodes. The bias plasma system 44 serves to enhance the transport of plasma species created by the source plasma system 42 to the surface of the substrate to enhance the sputtering component during deposition. In a specific embodiment, the RF bias generator 86 provides up to 5000 W of RF power at 13.56 MHz.

Other measures may also help stabilize a plasma. For example, the RF control circuit can be used to determine the power delivered to the load (plasma) and may increase or decrease the generator output power to keep the delivered power substantially constant during deposition of a layer.

The gas delivery system 46 provides gases from several sources to the process chamber for processing the substrate via gas delivery lines 92 (only some of which are shown). Gases are introduced into the process chamber 38 through a gas ring 94, a top nozzle 96, and a top vent 98.

Figure 6:
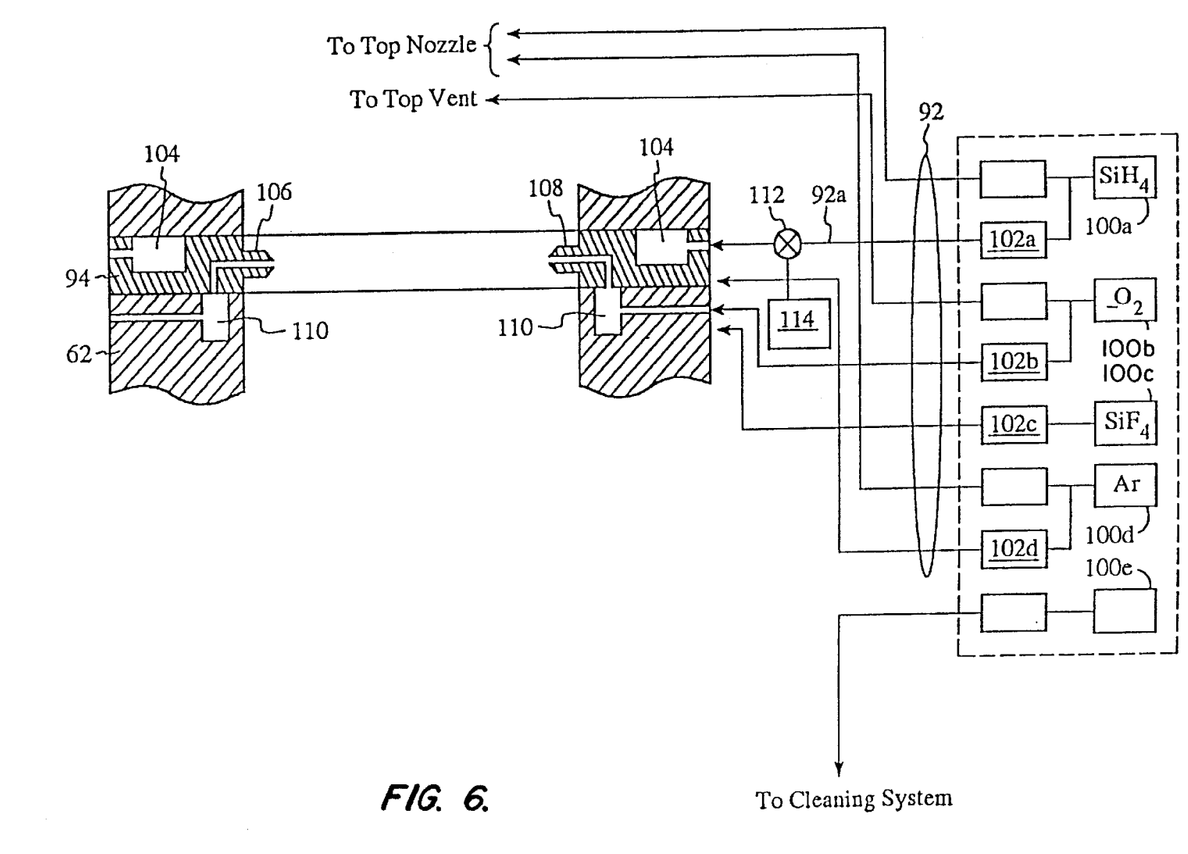
FIG. 6 is a simplified cross-section of a gas ring that may be used in conjunction with the exemplary CVD process chamber of FIG. 5.

Referring to FIGS. 5 and 6, first and second gas sources, 100a and 100b, and first and second gas flow controllers, 102a and 102b, provide gas to ring plenum 104 in gas ring 94 via gas delivery lines 92 (only some of which are shown). Gas ring 94 has a plurality of gas nozzles 106 and 108 (only two of which is shown) that provide a uniform flow of gas over the substrate. Nozzle length and nozzle angle may be changed by changing gas ring 94. This allows tailoring the uniformity profile and gas utilization efficiency for a particular process within an individual process chamber. In a specific embodiment, the gas ring 94 has a total of twenty-four gas nozzles, twelve first gas nozzles 108 and twelve second gas nozzles 106.

Gas ring 94 has a plurality of first gas nozzles 108 (only one of which is shown), which in a preferred embodiment are coplanar with, and shorter than, a plurality of second gas nozzles 106. In one embodiment, first gas nozzles 108 receive one or more gases from body plenum 110, and second gas nozzles 106 receive one or more gases from gas ring plenum 104. In some embodiments, it is desirable not to mix gases in the body plenum 110 and the gas ring plenum 104 before injecting the gases into the process chamber 38, such as when the first gas nozzles are used to deliver oxidizer gas and the second gas nozzles are used to deliver source gas. In other embodiments, process gases may be mixed prior to injecting the gases into the process chamber 38 by providing apertures (not shown) between body plenum 110 and gas ring plenum 104. In one embodiment, third and fourth gas sources, 100c and 100d, and third and fourth gas flow controllers, 102c and 102d, provide gas to body plenum via gas delivery lines 92. Additional valves, such as 112 (other valves not shown), may shut off gas from the flow controllers to the process chamber.

In some embodiments, flammable, toxic, or corrosive gases, such as silane or nitrogen trifluoride, may be used. In these instances, it may be desirable to eliminate gas remaining in the gas delivery lines after a deposition. This may be accomplished using a three-way valve, such as valve 112, to isolate process chamber 38 from delivery line 92a, and to vent delivery line 92a to vacuum foreline 114, for example. As shown in FIG. 5, other similar valves, such as 112A and 112B, may be incorporated on other gas delivery lines. Such three-way valves may be placed as close to process chamber 38 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

Referring again to FIG. 5, the top nozzle 96 and top vent 98 allow independent control of top and side flows of the gases, which improves film uniformity and allows fine adjustment of the film's deposition and doping parameters. The top vent 98 is an annular opening around the top nozzle 96 through which gas may flow into the process chamber from the gas delivery system. In one embodiment, the first gas source 100a is a silane source that supplies gas nozzles 106 and top nozzle 96. Source nozzle MFC 102a controls the amount of silane delivered to gas nozzles 106 and top nozzle MFC 120a controls the amount of silane delivered to top gas nozzle 96. Similarly, two MFCs 102b and 120b may be used to control the flow of oxygen to both top vent 98 and first gas nozzles 108 from a single source of oxygen, such as source 100b. The single source of oxygen is typically used for forming an oxide. In another embodiment where an FSG layer is to be formed, for example, the oxygen is typically combined with a fluorine source such as $SiF_4$. The gases supplied to top nozzle 96 and top vent 98 may be kept separate prior to flowing the gases into process chamber 38, or the gases may be mixed in top plenum 112a before they flow into process chamber 38. Separate sources of the same gas may be used to supply various portions of the process chamber, typically where the premixture is chemically stable.

The remote microwave-generated plasma cleaning system 48 is provided to periodically clean deposition residues from process chamber components. The cleaning system includes a remote microwave generator 124 that creates a plasma from a cleaning gas source 100e, such as fluorine, nitrogen trifluoride, or equivalents, in reactor cavity 126. The reactive species resulting from this plasma are conveyed to process chamber 38 through cleaning gas feed port 128 via applicator tube 130. The materials used to contain the cleaning plasma (e.g., cavity 126 and applicator tube 130) should be resistant to attack by the plasma. The distance between reactor cavity 126 and feed port 128 should be kept as short as practical, as the concentration of desirable plasma species may decline with distance from reactor cavity 126. Generating the cleaning plasma in a remote cavity allows the use of an efficient microwave generator and does not subject process chamber components to the temperature, radiation, or bombardment of the glow discharge that may be present in an in situ plasma. Consequently, relatively sensitive components, such as the electrostatic chuck 68, do not need to be covered with a dummy wafer or otherwise protected, as may be required with an in situ plasma cleaning process. During the cleaning process, or other processes, the gate valve 74 may be closed to isolate the turbomolecular vacuum pump 76 from the process chamber. In this configuration, the foreline 114 provides a process vacuum generated by remote vacuum pumps, which are typically mechanical vacuum pumps. Isolating the turbomolecular pump from the process chamber with the gate valve protects the turbomolecular pump from corrosive compounds or other potentially harmful effects resulting from the process chamber clean or other processes.

A system controller 132 regulates the operation of system 36 and includes a processor 134 in electrical communication therewith to regulate the operations thereof. Typically, the processor 134 is part of a single-board computer (SBC), that includes analog and digital input/output boards, interface boards and stepper motor controller boards. Various components of the CVD system 36 conform to the Versa Modular European (VME) standard, which defines board, card cage, as well as connector type and dimensions. The VME standard also defines the bus structure as having a 16-bit data bus and a 24-bit address bus. The processor 134 executes system control software, which is a computer program stored in a memory 136, electronically coupled to the processor 134. Any type of memory device may be employed, such as a hard disk drive, a floppy disk drive, a card rack or a combination thereof. The system control software includes sets of instructions that dictate the timing, mixture of gases, process chamber pressure, process chamber temperature, microwave power levels, pedestal position, and other parameters of a particular process, discussed more fully below with respect to FIG. 8.

Figure 7:
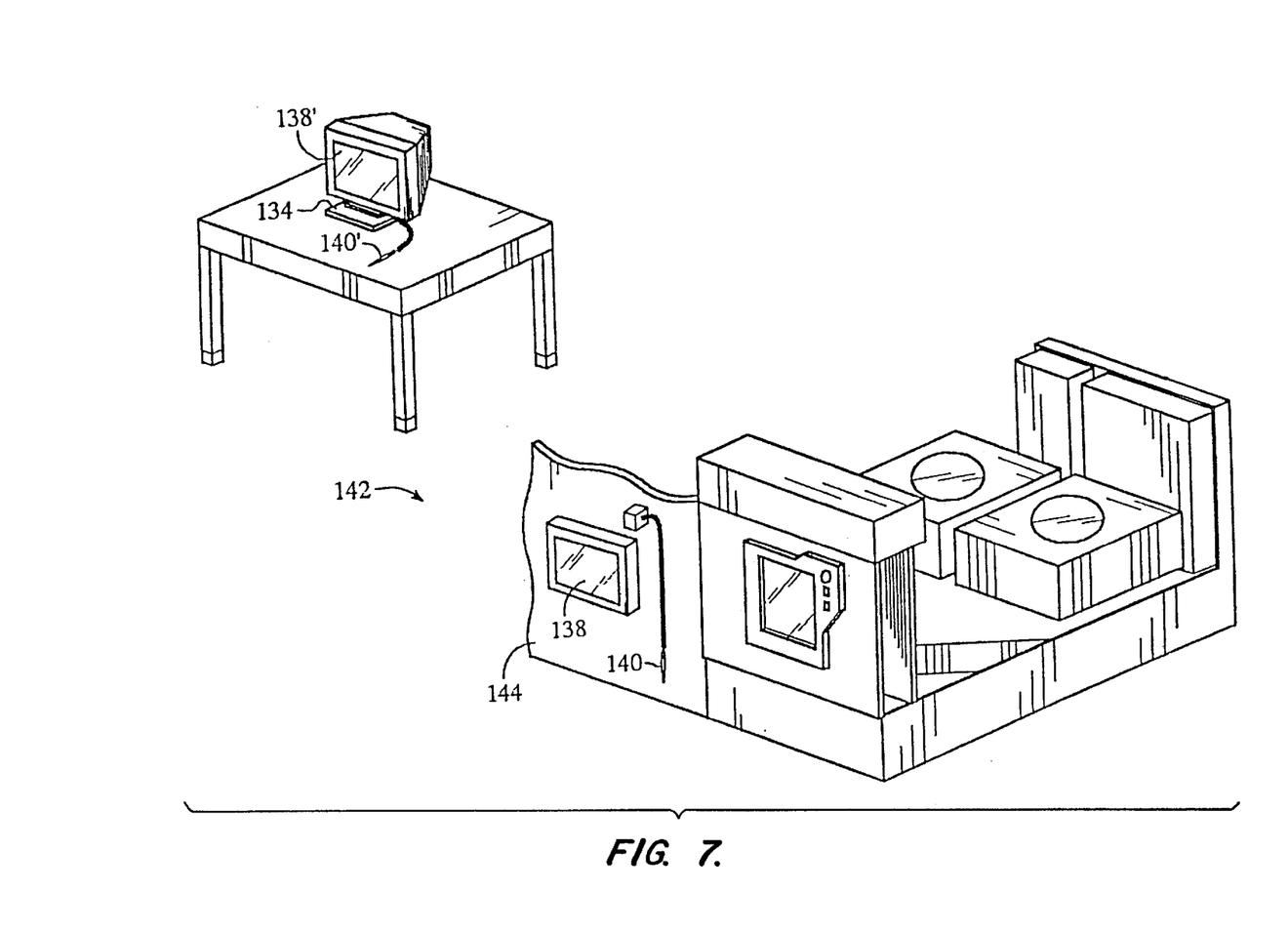
FIG. 7 is a simplified diagram of a monitor and light pen that may be used in conjunction with the exemplary CVD process chamber of FIG. 5.

Referring to FIG. 7, the interface between a user and the processor 134 is via a CRT monitor 138 and light pen 140. In the preferred embodiment two monitors 138 and 138' are used, each having a light pen associated therewith, 140 and 140', respectively. One of the monitors 138 is mounted in a clean room wall 144 for the operators and the other behind the wall for the service technicians. The CRT monitors 138 and 138' may simultaneously display the same information, but only one of the light pens 140 and 140' is enabled for data input during any given time. Were light pen 140 employed to communicate with the processor 134, an operator would place the same on the screen of the CRT monitor 138. A light sensor (not shown) located at the tip of the light pen 140 detects light emitted by the CRT monitor 138. To select a particular screen or function, the operator touches a designated area of the CRT monitor 138 and pushes a button (not shown) on the light pen 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 134.

The process for depositing the film can be implemented using a computer program product that is executed by the processor 134. The computer program code can be written in any conventional computer readable programming language, for example, 68000 assembly language, C, C++, Pascal, Fortran or others. Suitable program code is entered into a single file, or multiple files, using a conventional text editor, and stored or embodied in a computer usable medium, such as the memory 136, shown in FIG. 5. If the entered code text is in a high level language, the code is compiled, and the resultant compiler code is then linked with an object code of precompiled Windows™ library routines. To execute the linked, compiled object code the system user invokes the object code, causing the processor 134 to load the code in the memory 136. The processor 134 then reads and executes the code to perform the tasks identified in the program.

Figure 8:
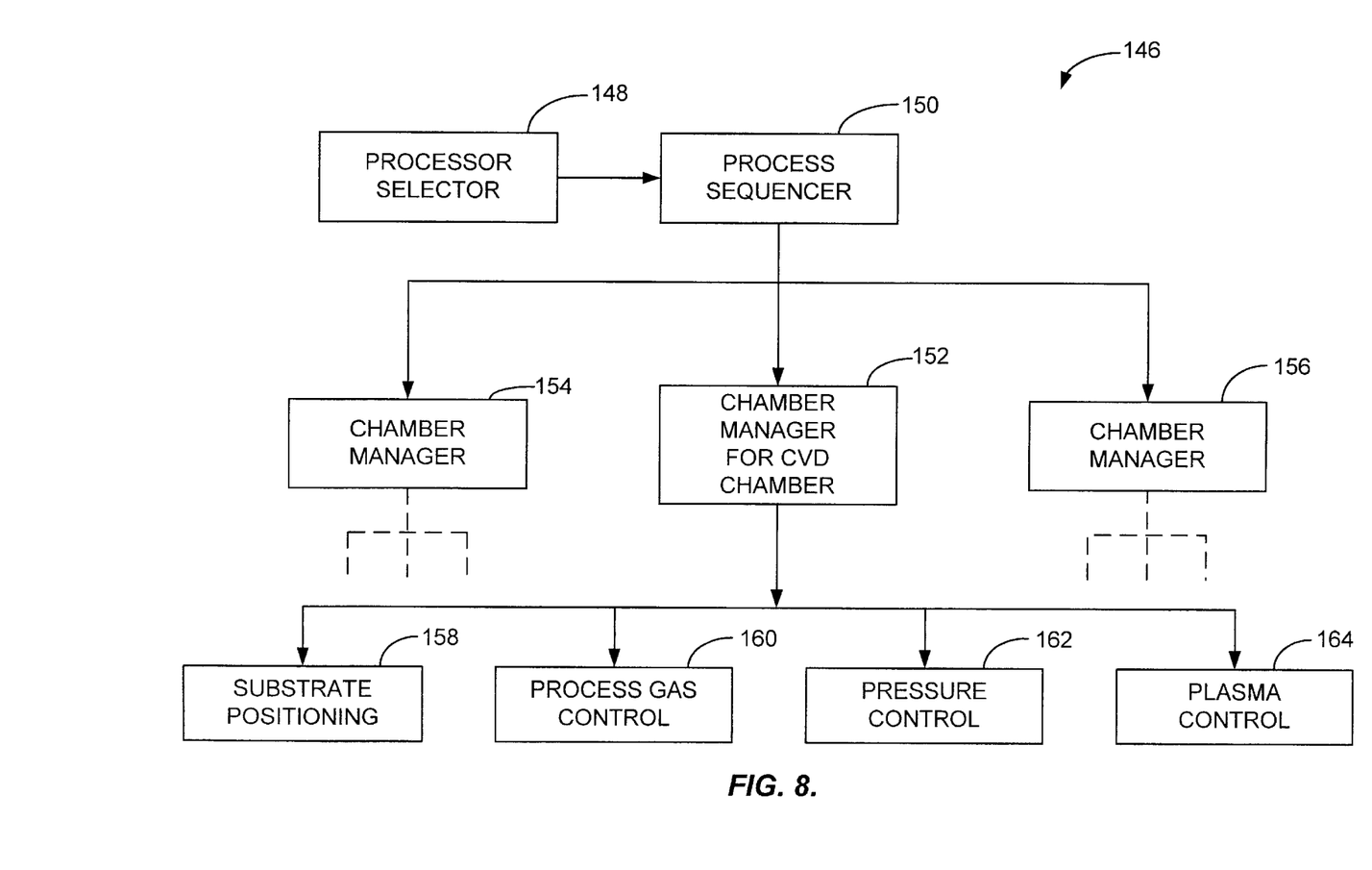
FIG. 8 is a flow chart of an exemplary process control computer program product used to control the exemplary CVD process chamber of FIG. 5.

FIG. 8 shows an illustrative block diagram of the hierarchical control structure of system control software 146. A user enters a process set number and process chamber number into a process selector subroutine 148 in response to menus or screens displayed on the CRT monitor by using the light pen interface. The process sets are predetermined sets of process parameters necessary to carry out specified processes, and are identified by predefined set numbers. Process selector subroutine 148 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and process chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of the system controller.

A process sequencer subroutine 150 comprises program code for accepting the identified process chamber and set of process parameters from the process selector subroutine 148, and for controlling operation of the various process chambers. Multiple users can enter process set numbers and process chamber numbers, or a user can enter multiple process set numbers and process chamber numbers, so sequencer subroutine 150 operates to schedule the selected processes in the desired sequence. Preferably, sequencer subroutine 150 includes a program code to perform the steps of (i) monitoring the operation of the process chambers to determine if the process chambers are being used, (ii) determining what processes are being carried out in the process chambers being used, and (iii) executing the desired process based on availability of a process chamber and type of process to be carried out. Conventional methods of monitoring the process chambers can be used, such as polling. When scheduling which process is to be executed, sequencer subroutine 150 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 150 determines which process chamber and process set combination is going to be executed next, sequencer subroutine 150 causes execution of the process set by passing the particular process set parameters to process chamber manager subroutines 152, 154 and 156, which control multiple processing tasks in process chamber 38 and possibly other process chambers (not shown) according to the process set determined by sequencer subroutine 150.

Examples of process chamber component subroutines are substrate positioning subroutine 158, process gas control subroutine 160, pressure control subroutine 162, and plasma control subroutine 164. Those having ordinary skill in the art will recognize that other process chamber control subroutines can be included depending on what processes are desired to be performed in process chamber 38. In operation, process chamber manager subroutine 152 selectively schedules or calls the process component subroutines in accordance with the particular process set being executed. Scheduling by process chamber manager subroutine 152 is performed in a manner similar to that used by sequencer subroutine 150 in scheduling which process chamber and process set to execute. Typically, process chamber manager subroutine 152 includes steps of monitoring the various process chamber components, determining which components need to be operated based on the process parameters for the process set to be executed, and causing execution of a process chamber component subroutine responsive to the monitoring and determining steps.

Referring to both FIGS. 5 and 8, in operation the substrate positioning subroutine 158 (FIG. 8) comprises program code for controlling process chamber components that are used to load the substrate 54 onto substrate support number 68 (FIG.

5). The substrate positioning subroutine 158 may also control transfer of a substrate into process chamber 38 from, e.g., a plasma-assisted CVD reactor or other reactor in the multichamber system, after other processing has been completed.

The process gas control subroutine 160 has program code for controlling process gas composition and flow rates. Subroutine 160 controls the open/close position of the safety shut-off valves, and also ramps up/down the mass flow controllers to obtain the desired gas flow rates. All process chamber component subroutines, including process gas control subroutine 160, are invoked by process chamber manager subroutine 152. Subroutine 160 receives process parameters from process chamber manager subroutine 152 related to the desired gas flow rates.

Typically, process gas control subroutine 160 operates by opening the gas supply lines, and repeatedly (i) reading the necessary mass flow controllers, (ii) comparing the readings to the desired flow rates received from process chamber manager subroutine 152, and (iii) adjusting the flow rates of the gas supply lines as necessary. Furthermore, process gas control subroutine 160 may include steps for monitoring the gas flow rates for unsafe rates, and activating the safety shut-off valves when an unsafe condition is detected.

In some processes, an inert gas is flowed into process chamber 13 to stabilize the pressure in the process chamber before reactive process gases are introduced into the process chamber. For these processes, the process gas control subroutine 160 is programmed to include steps for flowing the inert gas into process chamber 38 for an amount of time necessary to stabilize the pressure in the process chamber. The above-described steps may then be carried out.

Additionally, when a process gas is to be vaporized from a liquid precursor, for example, tetraethoxysilane (TEOS), the process gas control subroutine 160 may include steps for bubbling a delivery gas such as helium through the liquid precursor in a bubbler assembly or for introducing the helium to a liquid injection valve. For this type of process, the process gas control subroutine 160 regulates the flow of the delivery gas, the pressure in the bubbler, and the bubbler temperature to obtain the desired process gas flow rates. As discussed above, the desired process gas flow rates are transferred to process gas control subroutine 160 as process parameters.

Furthermore, the process gas control subroutine 160 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared with the necessary values and adjusted accordingly.

The process gas control subroutine 160 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 162 includes program code for controlling the pressure in process chamber 38 by regulating the size of the opening of throttle valve 72 in the exhaust portion of the process chamber. There are at least two basic methods of controlling the process chamber with the throttle valve. The first method relies on characterizing the process chamber pressure as it relates to, among other things, the total process gas flow, size of the process chamber, and pumping capacity. The first method sets throttle valve 72 to a fixed position. Setting throttle valve 72 to a fixed position may eventually result in a steady-state pressure.

Alternatively, the process chamber pressure may be measured with a manometer, for example, and throttle valve 72 position may be adjusted according to pressure control subroutine 162, assuming the control point is within the boundaries set by gas flows and exhaust capacity. The former method may result in quicker process chamber pressure changes, as the measurements, comparisons, and calculations associated with the latter method are not invoked. The former method may be desirable when precise control of the process chamber pressure is not required, whereas the latter method may be desirable when an accurate, repeatable, and stable pressure is desired, such as during the deposition of a layer.

When pressure control subroutine 162 is invoked, the desired (or target) pressure level is received as a parameter from process chamber manager subroutine 152. Pressure control subroutine 162 operates to measure the pressure in process chamber 38 by reading one or more conventional pressure manometers connected to the process chamber, compare the measure value(s) with the target pressure, obtain proportional, integral, and differential (PID) values from a stored pressure table corresponding to the target pressure, and adjust throttle valve 72 according to the PID values obtained from the pressure table. Alternatively, pressure control subroutine 162 may open or close throttle valve 72 to a particular opening size to regulate the pressure in process chamber 38 to a desired pressure or pressure range.

The plasma control subroutine 164 comprises program code for controlling the frequency and power output setting of RF generators 82 and 84, and for tuning matching networks 88 and 90. Plasma control subroutine 164, like the previously described process chamber component subroutines, is invoked by process chamber manager subroutine 152.

An example of a system which may incorporate some or all of the subsystems and routines described above would be an Ultima System, manufactured by applied Materials, configured to practice the present invention.

III. Exemplary Structure

Figure 9:
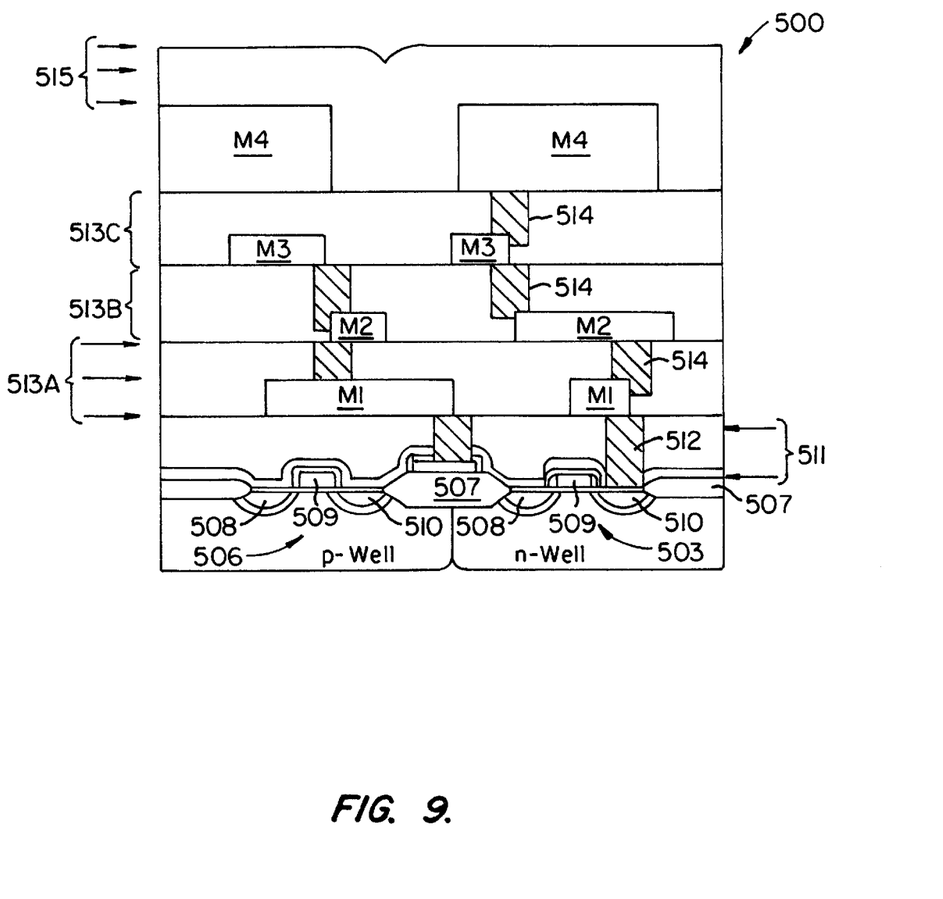
FIG. 9 is a cross-sectional view of an integrated circuit formed employing the present invention.

FIG. 9 illustrates a simplified cross-sectional view of an integrated circuit 500 incorporating features of the present invention. The integrated circuit 500 may be fabricated on a semiconductor wafer, such as a silicon wafer, gallium-arsenide wafer, or the like. As shown in FIG. 9, the integrated circuit 500 includes an NMOS transistor 503 and a PMOS transistor 506, which are separated and electrically isolated from each other by a field oxide region 507. Each transistor 503, 506 comprises a source region 508, a gate region 509, and a drain region 510.

A premetal dielectric layer 511 separates the transistors 503, 506 from the metal layer M1, with connections between the metal layer M1 and the transistors made by contacts 512. The metal layer M1 is one of four metal layers M1–M4 included in the integrated circuit 500. Each metal layer M1–M4 is separated from adjacent metal layers by respective intermetal dielectric (IMD) layers 513A–C. Adjacent metal layers are connected at selected openings by vias 514. A planar passivation layer 515 overlies the metal layer M4.

Embodiments of the present invention are particularly useful for IMD layers, but may find uses in each of the dielectric layers shown in the integrated circuit 500. It should be understood that the simplified integrated circuit 500 is for illustrative purposes only. One of ordinary skill in the art could implement the present method for fabrication of other integrated circuits, such as microprocessors, application-specific integrated circuits, memory devices, and the like. Additionally, the method of the present invention may be used in the fabrication of integrated circuits using other technologies, such as BiCMOS, NMOS, bipolar, and others.

The above-described arrangements of apparatus and methods are merely illustrative of applications of the principles of this invention and many other embodiments and modifications may be made without departing from the spirit and scope of the invention as defined in the claims. For instance, different processing conditions and different reactant sources can be used for depositing different dielectric layers without departing from the spirit of the invention. The scope of the invention should, therefore, be determined not with reference to the above description, but instead should be determined with reference to the appended claims along with their full scope of equivalents.

What is claimed is:

1. A method for forming an insulating layer on a substrate including a gap, the method comprising:

forming a first layer containing a dielectric material over the substrate to partially fill the gap;

forming a second layer containing a dielectric material which is at least substantially undoped over the first layer to at least substantially fill the gap, the second layer being substantially smaller in thickness than the first layer, the dielectric material in the second layer being different from the dielectric material in the first layer; and forming a third layer containing a dielectric material over the second layer, the dielectric material in the third layer being different from the dielectric material in the second layer.

2. The method of claim 1 wherein the first layer comprises a doped dielectric material.

3. The method of claim 2 wherein the doped dielectric material comprises a halogen-doped dielectric material.

4. The method of claim 2 wherein the doped dielectric material comprises doped silicon glass.

5. The method of claim 1 wherein the dielectric material in the second layer comprises silicon.

6. The method of claim 1 wherein the dielectric material in the second layer comprises at least one of oxygen, nitrogen, and carbon.

7. The method of claim 1 wherein the third layer comprises a doped dielectric material.

8. The method of claim 1 wherein the dielectric material in the first layer has a lower dielectric constant than the dielectric material in the second layer.

9. The method of claim 1 wherein the second layer has a thickness of less than about 500 Å.

10. The method of claim 9 wherein the second layer has a thickness of about 50 Å to about 200 Å.

11. The method of claim 1 wherein the first layer fills more than about 75% of the gap.

12. The method of claim 11 wherein the first layer fills about 80% to about 90% of the gap.

13. The method of claim 1 further comprising performing a planarization on the substrate to a level at or above the opening of the gap.

14. The method of claim 13 wherein the planarization is performed by chemical mechanical polishing.

15. A method for forming an insulating layer on a substrate including a gap, the method comprising:

forming a first layer containing a dielectric material over the substrate to partially fill the gap;

forming a second layer containing a dielectric material over the first layer to at least substantially fill the gap, the second layer being substantially smaller in thickness than the first layer, the dielectric material in the second layer having a higher dielectric constant than the dielectric material in the first layer; and performing a planarization on the substrate to a level at or above the opening of the gap, wherein the opening of the gap is covered substantially by the dielectric material of the second layer after planarization.

16. The method of claim 15 wherein at least about 75% of the opening of the gap is covered by the dielectric material of the second layer after planarization.

17. The method of claim 15 further comprising, prior to planarization, forming a third layer containing a dielectric material over the second layer, the dielectric material in the third layer having a lower dielectric constant than the dielectric material in the second layer.

18. The method of claim 15 wherein the first layer comprises a halogen-doped dielectric material or a porous silicon glass.

19. The method of claim 15 wherein the first layer is formed by placing the substrate in a process chamber; flowing a process gas mixture containing precursor of the dielectric material of the first layer into the process chamber; and forming a plasma in the process chamber to deposit the first layer.

20. The method of claim 15 wherein the first layer is formed by placing the substrate in a process chamber and flowing a process gas mixture including halogen dopants into the process chamber; wherein the second layer is formed over the first layer by adjusting the process gas mixture into the process chamber to at least substantially eliminate the halogen dopants; and wherein the third layer is formed over the second layer by adjusting the process gas mixture into the process chamber to increase the amount of the halogen dopants from the amount of the halogen dopants for forming the second layer.

* * * * *